United States Patent
Kirihara et al.

(10) Patent No.: US 11,417,818 B2
(45) Date of Patent: Aug. 16, 2022

(54) THERMOELECTRIC CONVERSION ELEMENT

(71) Applicant: NEC CORPORATION, Tokyo (JP)

(72) Inventors: Akihiro Kirihara, Tokyo (JP); Masahiko Ishida, Tokyo (JP)

(73) Assignee: NEC CORPORATION, Tokyo (JP)

( * ) Notice: Subject to any disclaimer, the term of this patent is extended or adjusted under 35 U.S.C. 154(b) by 240 days.

(21) Appl. No.: 16/772,020

(22) PCT Filed: Dec. 14, 2018

(86) PCT No.: PCT/JP2018/046125
§ 371 (c)(1),
(2) Date: Jun. 11, 2020

(87) PCT Pub. No.: WO2019/124257
PCT Pub. Date: Jun. 27, 2019

(65) Prior Publication Data
US 2020/0335682 A1    Oct. 22, 2020

(30) Foreign Application Priority Data

Dec. 20, 2017    (JP) .............................. JP2017-244458

(51) Int. Cl.
*H01L 37/04*    (2006.01)
*B22F 7/02*    (2006.01)
*H01L 29/82*    (2006.01)

(52) U.S. Cl.
CPC .............. *H01L 37/04* (2013.01); *B22F 7/02* (2013.01); *H01L 29/82* (2013.01)

(58) Field of Classification Search
CPC ........ H01L 37/04; B22F 2998/10; B22F 1/17; B22F 3/10; B22F 7/02; B22F 7/08
See application file for complete search history.

(56) References Cited

U.S. PATENT DOCUMENTS

| 8,999,230 B1 * | 4/2015 | Nagarathnam | ........... B22F 3/23 |
| | | | 75/228 |
| 9,496,474 B2 * | 11/2016 | Kirihara | .................. H01L 37/00 |

(Continued)

FOREIGN PATENT DOCUMENTS

| JP | 2009-117650 A | 5/2009 |
| JP | 2010-166053 A | 7/2010 |

(Continued)

OTHER PUBLICATIONS

Ken-ichi Uchida et al. "Local Spin-Seebeck Effect Enabling Two-Dimensional Position Sensing", 2011 Jpn. J. Appl. Phys. 50 120211. (Year: 2011).*

(Continued)

*Primary Examiner* — Scott B Geyer
(74) *Attorney, Agent, or Firm* — Sughrue Mion, PLLC

(57) ABSTRACT

The purpose of the present invention is to make it possible to ensure a strength that allows thermoelectric evaluation to be performed even when sintering is carried out at a temperature lower than the minimum sintering temperature of a power generation layer, in a thermoelectric conversion element. For this purpose, this thermoelectric conversion element is characterized by being provided with a power generation layer and support layers including a sintered body, wherein the power generation layer is provided with a metal-magnetic insulator composite structure in which metal is formed in a net shape around a granulated magnetic body, the support layers are formed so as to be in contact with the top and bottom or the right and left of the power generation layer, and the minimum sintering temperature of the support layers is lower than the minimum sintering temperature of the power generation layer.

20 Claims, 10 Drawing Sheets

(56) References Cited

U.S. PATENT DOCUMENTS

| | | | | |
|---|---|---|---|---|
| 2013/0312802 A1* | 11/2013 | Kirihara | ............... | H01L 37/00 136/201 |
| 2015/0093282 A1* | 4/2015 | Bell | ............... | B22F 1/17 419/38 |
| 2015/0380630 A1* | 12/2015 | Ishida | ............... | H01L 37/00 136/205 |

FOREIGN PATENT DOCUMENTS

| | | |
|---|---|---|
| JP | 2015-192013 A | 11/2015 |
| JP | 2016-009838 A | 1/2016 |
| WO | 2009/151000 A1 | 12/2009 |

OTHER PUBLICATIONS

Daniel Meier et al. "Longitudinal spin Seebeck effect contribution in transverse spin Seebeck effect experiments in Pt/YIG and Pt? NFO", Nature Communications, 2015, 7 pages. (Year: 2015).*

Gene Seigel et al. "Robust longitudinal spin-Seebeck effectr in Bi-YIG thin films", Scientific Reports, 4:4429, 2014, 6 pages. (Year: 2014).*

Akihiro Kirihara, et al., "Spin-current-driven thermoelectric coating", Nature Materials, Aug. 2012, pp. 686-689, vol. 11.

B.F. Miao, et al., "Inverse Spin Hall Effect in a Ferromagnetic Metal", Physical Review Letters, Aug. 9, 2013, 066602-1-066602-5, vol. 111.

Ken-Ichi Uchida, et al., "Longitudinal spin-Seebeck effect in sintered polycrystalline (Mn, Zn)Fe$_2$O$_4$", Applied Physics Letters, 2010, pp. 262504-262504-3, vol. 97.

R. Ramos, et al., "Unconventional Scaling and Significant Enhancement of the Spin Seebeck Effect in Multilayers" Physical Review, 2015, 220407-1-220407-5.

International Search Report for PCT/JP2018/046125 dated Feb. 19, 2019 [PCT/ISA/210].

Written Opinion for PCT/JP2018/046125 dated Feb. 19, 2019 [PCT/ISA/237].

* cited by examiner

SECTIONAL VIEW OF POWER GENERATION LAYER SINTERED AT 600°C

SECTIONAL VIEW OF POWER GENERATION LAYER SINTERED AT 900°C

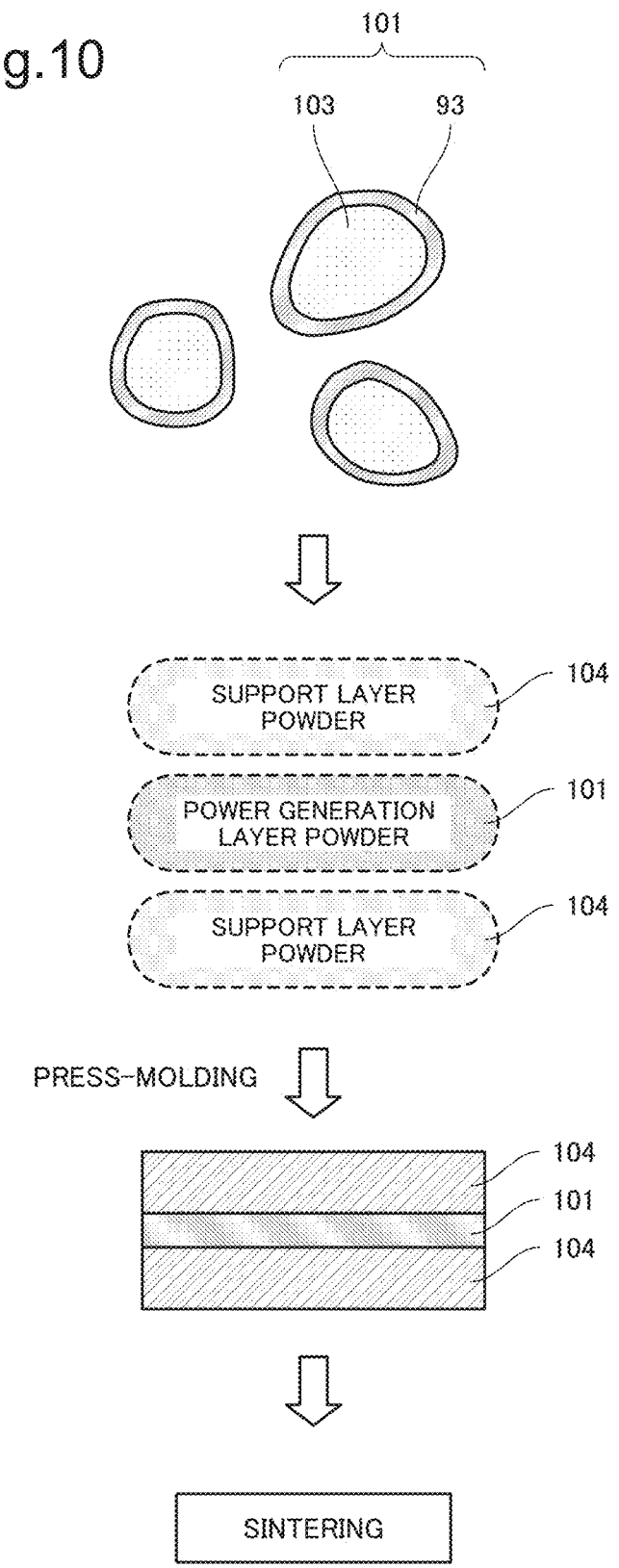

THERMOELECTRIC CONVERSION ELEMENT

CROSS REFERENCE TO RELATED APPLICATIONS

This application is a National Stage of International Application No. PCT/JP2018/046125 filed Dec. 14, 2018, claiming priority based on Japanese Patent Application No. JP 2017-244458 filed Dec. 20, 2017, the disclosure of which is incorporated herein in its entirety by reference.

TECHNICAL FIELD

The present invention relates to a thermoelectric conversion element based on a spin Seebeck effect.

BACKGROUND ART

As one of thermal management techniques for a sustainable society, there is a growing expectation for a thermoelectric conversion element. Heat is the most common energy source that can be collected from various scenes such as a body temperature, a solar heat, an engine, or an industrial exhaust heat. Thus, it is expected that thermoelectric conversion becomes more and more important in various usages such as high efficiency of energy utilization, power supply to a ubiquitous terminal, a sensor, and the like, or visualization of a thermal flow by thermal flow sensing.

In such a circumstance, a thermoelectric conversion element based on the "spin Seebeck effect" of generating a spin angular momentum flow (a spin flow) by applying a temperature gradient (a temperature difference) to a magnetic material has been proposed in recent years (PTL 1 and NPL 1). The thermoelectric conversion element based on the spin Seebeck effect is composed of: a magnetic insulator layer having magnetism in one direction; and an electromotive film having conductivity. When the temperature gradient in a perpendicular direction is applied to this element, the spin angular momentum flow referred to as the spin flow is induced in the magnetic insulator by the spin Seebeck effect. After the spin flow is charged in the electromotive film, the charged spin flow is converted to an electric current in an in-plane direction by an "inverse spin Hall effect" in the electromotive film. This enables the "thermoelectric conversion" of generating electricity from the temperature gradient. The thermoelectric conversion element is composed by employing a magnetic insulator with a comparatively small thermal conductivity, thus enabling retention of a temperature difference that is a requirement for performing effective thermoelectric conversion.

As composing methods of a thermoelectric conversion element based on the spin Seebeck effect, the following structures are proposed: 1. a structure composed of a bulky magnetic insulator and a metal thin film (NPL 1); 2. a structure composed of a magnetic insulator thin film and a metal thin film (NPL 2); 3. a structure composed of an alternately laminated structure of a magnetic insulator thin film and a metal thin film (NPL 3); 4. a composite structure with a magnetic insulator thin film and a metal thin film (PTL 2); and the like. Among the above structures, the item 4 proposes a metal-magnetic insulator composite structure in which a metal film is formed on a particle surface of a magnetic insulator powder and then the powder is sintered, and a metal is thereby dispersed in a net shape.

On the other hand, apart from the spin Seebeck effect, another kind of thermoelectric effect referred to as an anomalous Nernst effect in a conductive magnetic metal is conventionally known as well. A thermoelectric conversion element based on an anisotropic Nernst effect is composed of a magnetic metal layer such as Ni or Fe having magnetism in one direction, and when a temperature gradient in a perpendicular direction is applied to the metal layer, a current is driven in the in-plane direction. Both the spin Seebeck effect and the anomalous Nernst effect are effects having a similar symmetricity that the electromotive power in the in-plane direction is induced by the temperature gradient in the perpendicular direction, and therefore, development of a hybrid type spin thermoelectric element using these two effects together is reported as well (NPL 4).

CITATION LIST

Patent Literature

[PTL 1] International Publication No. WO 2009/151000
[PTL 2] Japanese Unexamined Patent Application Publication No. 2016-009838

Non Patent Literature

[NPL 1] Ken-ichi Uchida, Tatsumi Nonaka, Takeru Ota, and Eiji Saitoh, "Longitudinal spin-Seebeck effect in sintered polycrystalline (Mn,Zn)FeO", Appl. Phys. Lett. 97, 262504 (2010)
[NPL 2] Akihiro Kirihara, Ken-ichi Uchida, Yosuke Kajiwara, Masahiko Ishida, Yasunobu Nakamura, Takashi Manako, Eiji Saitoh and Shinichi Yorozu, "Spin-current-driven thermoelectric coating", Nature Materials 11, 686 (2012)
[NPL 3] R. Ramos, T. Kikkawa, M. H. Aguirre, I. Lucas, A. Anadon, T. Oyake, K. Uchida, H. Adachi, J. Shiomi, P. A. Algarabel, L. Morellon, S. Maekawa, E. Saitoh, and M. R. Ibarra, "Unconventional scaling and significant enhancement of the spin Seebeck effect in multilayers", Phys. Rev. B 92, 220407(R) (2015)
[NPL 4] B. F. Miao, S. Y. Huang, D. Qu, and C. L. Chien, "Inverse Spin Hall Effect in a Ferromagnetic Metal", Phys. Rev. Lett. 111, 066602 (2013)

SUMMARY OF INVENTION

Technical Problem

However, there is a problem in performing effective thermoelectric power generation by a spin Seebeck element. In the case of thermoelectric power generation, in order to retain a temperature difference to be applied to the element, it is generally necessary to effectively convert a thermal energy to electricity while ensuring a certain thickness of the element.

Among the four structures described above, in the magnetic insulator thin film/metal thin film of the item 2, it is difficult to cause a thin thermoelectric power generation unit to have a sufficient temperature difference, and it is difficult to perform effective thermoelectric power generation. In addition, in the structure employing a thick bulky magnetic insulator as in the item 1, although a temperature difference is easily applied to the element, thermoelectric power generation efficiency is on the same order as the item 2 because of relaxation (attenuation) of the spin flow in the magnetic insulator.

Because of this relaxation problem of the spin flow in the magnetic insulator, it is necessary to alternatively laminate the metal and the magnetic insulator as in the item 3 or to form a composite structure as in the item 4, in order to perform effective temperature difference power generation in the spin Seebeck element.

Among the above, multilayered lamination as in the item 3 is not realistic in view of a manufacturing cost, and the composite structuring as in the item 4 is regarded as a more promising approach.

However, there are many issues in actually forming such a structure. When sintering is carried out at a high temperature, a metal with a great surface energy aggregates at a specific part and the above-described dispersed metal net cannot be formed. When a heat treatment temperature is decreased, a network type composite structure is maintained, however, powder sintering becomes incomplete, and therefore, a break easily occurs and a practically sufficient strength cannot be ensured.

An object of the present invention is to ensure a strength that allows thermoelectric evaluation to be performed even when sintering is carried out at a temperature lower than a minimum sintering temperature of a power generation layer, in a thermoelectric conversion element employing a metal-magnetic insulator composite structure.

Solution to Problem

A thermoelectric conversion element according to the present invention includes: a support layer including a power generation layer and a sintered body, wherein the power generation layer includes a metal-magnetic body composite structure in which a metal is formed in a net shape, around a sintered body of a granulated magnetic insulator, the support layer is formed in such a way as to be in contact with the top and bottom or the left and right of the power generation layer, and a minimum sintering temperature of the support layer is lower than a minimum sintering temperature of the power generation layer.

A method of manufacturing a thermoelectric conversion element according to the present invention includes: sandwiching a power generation layer powder formed by coating a periphery of a granulated magnetic body with a metal, between support layer powders of which a minimum sintering temperature is lower than a minimum sintering temperature of the power generation layer powder; and press-molding and thereafter sintering.

Advantageous Effects of Invention

The present invention is able to ensure a strength that allows thermoelectric evaluation to be performed even when sintering is carried out at a lower temperature than a minimum sintering temperature of a power generation layer, in a thermoelectric conversion element employing a metal-magnetic insulator composite structure.

BRIEF DESCRIPTION OF DRAWINGS

FIG. 10 is a diagram describing a method of manufacturing the thermoelectric conversion element according to the fourth example embodiment of the present invention.

EXAMPLE EMBODIMENT

Hereinafter, example embodiments of the present invention will be described in detail with reference to the drawings.

First Example Embodiment

Figure 1:
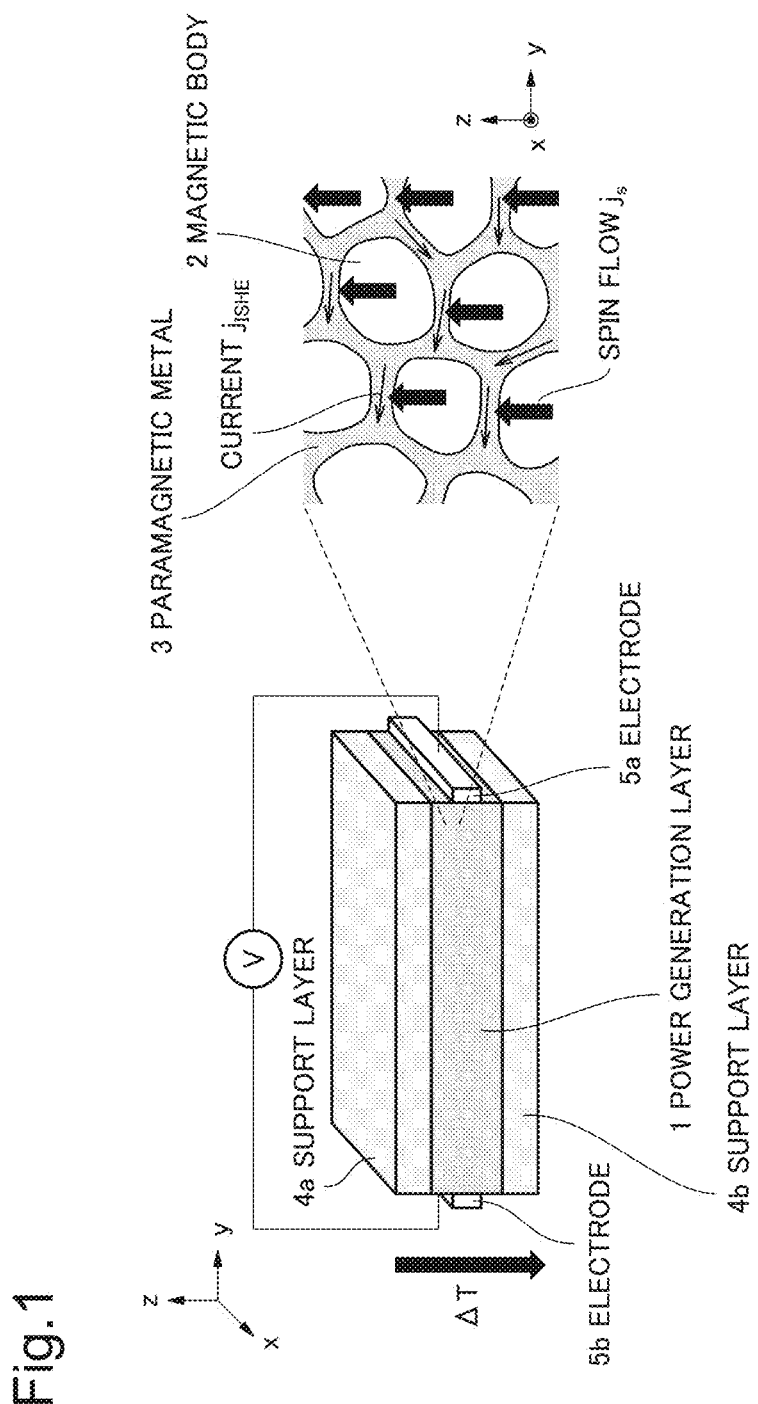
FIG. 1 is a perspective view illustrating a thermoelectric conversion element according to a first example embodiment of the present invention and a sectional view of a power generation layer.

FIG. 1 illustrates a schematic diagram of a thermoelectric conversion element that is a first example embodiment of the present invention. The present example embodiment assumes a usage of thermoelectrically generating power by applying a temperature difference in a z direction of the figure to a rectangular parallelepiped-shaped element, and the following description assumes that the z direction is a perpendicular direction and the direction in an xy plane is an in-plane direction.

A power generation layer 1 is composed of a paramagnetic metal-magnetic insulator composite structure in which a paramagnetic metal 3 is formed in a net shape around a granulated magnetic body 2. In other words, the power generating layer 1 is an aggregation in which the granulated individual magnetic body 2 covered with the paramagnetic metal 3 gather in intimate contact with one another, wherein the adjacent paramagnetic metals connect to one another, and form a net shape.

Further, in other words, particles of a magnetic insulator material are disposed in such a way as to be spaced from one another, and a paramagnetic metal material is extended in a net shape in such a way as to cover the particles and fill gaps among the particles. The paramagnetic metal 3 takes a three-dimensional network structure in a composite, entirely electrically connects between two ends of the power generation layer 1 without disconnection, and has conductivity. The paramagnetic metal 3 may not completely cover the periphery of the particles of the magnetic body 2. According to a manufacturing method or a manufacturing condition, there may be formed, for example, a location in which particles are in direct contact with each other and the paramagnetic metal 3 does not exist between the particles, a location being a space in which a metal is not charged in a gap between the particles, a location in which the thickness of the covering paramagnetic metal 3 is not uniform and is small, or the like. Even in such a case, as long as the paramagnetic metal 3 entirely connects between electrodes 5a and 5b, a current $j_{ISHE}$ flows. For example, it is considered that the current $j_{ISHE}$ flows when the paramagnetic metal 3 covers the periphery of the particles of the magnetic body 2 at a percentage equal to or more than 60%.

This power generation layer 1 has a structure in which support layers 4a and 4b for enhancing the strength of the element are disposed on a top and a bottom of the power generation layer, that is, a first plane in a +z direction and a second plane in a −z direction of the figure, respectively.

Herein, as the magnetic body 2, it is desirable to employ a low thermal conductive material enabling efficient retention of a temperature difference, and it is desirable to employ a magnetic insulator that does not have electric conductivity. As such a magnetic insulator, for example, an yttrium iron garnet (YIG), a $(Ni, Zn, Fe)_3O_4$ ferrite, or the like can be employed. Herein, the magnetic body 2 has magnetism in the in-plane direction (the x direction of FIG. 1). It is desirable that, in order to maximize the power generation efficiency, the particle size of the individual granulated magnetic body 2 is on the order of a relaxation length of the spin flow (a magnon flow) induced by the spin Seebeck effect, and it is desirable that the specific average particle size is equal to or more than 300 nm and equal to or less than 10 μm.

As the paramagnetic metal 3, it is desirable to employ Pt, W, Ta, Au, Pd, Ru, or Ir, of which spin orbit interaction is great or an alloy material including these metals.

As the support layers 4a and 4b, it is desirable to employ a nonconductive insulator material or a semiconductor material of which resistivity is equal to or more than 1 Ωm, in order to take out the electromotive power generated in the power generation layer 1 to the outside in a lossless manner.

Further, as a material constituting the support layers 4a and 4b, it is desirable that the melting point is lower than a melting point of the metal material or magnetic insulator material constituting the power generation layer, in terms of production which will be described later. The thermoelectric conversion element based on the spin Seebeck effect is expected to be practically used in a temperature range equal to or lower than the Curie temperature of the magnetic body 2, and in order that the support layers 4a and 4b are not melted in such a temperature range, it is preferable that the melting point of the material of the support layers 4a and 4b is higher than the Curie temperature of the magnetic body 2. Assuming that, for example, a ferrite material (Curie temperature: 300° C. to 400° C. and melting point: 1,200° C. to 1,700° C.) is employed as the magnetic body 2 and a transient metal material (melting point: 1,200° C. to 3,000° C.) such as Pt is employed as the paramagnetic metal 3, it is desirable that the melting point of the material constituting the support layers 4a and 4b is equal to or more than 400° C. and equal to and less than 1,200° C. Specifically, bismuth oxide $Bi_2O_3$, molybdenum oxide $MoO_3$, germanium oxide $GeO_2$, or the like is suitable as a material for the support layers 4a and 4b.

Furthermore, the electrodes 5a and 5b for taking out the thermoelectromotive power generated in the y direction are provided on the left and right of the power generation layer 1, that is, on a third plane in a +y direction and a fourth plane in a −y direction of the figure. The electrodes 5a and 5b are composed of a metal material having conductivity. Although the electrodes 5a and 5b are intended to ensure electrical contact and stably take out the electromotive power, the electrodes are not required when the paramagnetic metal 3 is exposed on the surface of the power generation layer 1.

When a temperature gradient (a temperature difference ΔT) in the perpendicular direction (the z direction of FIG. 1) is applied to the element of such a structure, a spin flow is generated in an interface between the magnetic body 2 and the paramagnetic metal 3 by the spin Seebeck effect in the magnetic body 2. The generated spin flow is converted to an electromotive power in the in-plane direction by the inverse spin Hall effect in the paramagnetic metal 3. The paramagnetic metal 3 is extended and dispersed in a net shape in the power generation layer 1 and thus the electromotive power generated in each location of the composite body is entirely added, and the electromotive power in the in-plane direction (a y direction of FIG. 1) can be acquired from two ends of the power generation layer 1.

Herein, an element sintering temperature is set between a minimum sintering temperature of the support layer and a minimum sintering temperature of the power generation layer. Thus, by employing a material with a low melting point (and a sintering temperature) as a support layer, the element can be integrally solidified at a high strength even by heat treatment at a low temperature that is lower than an essential sintering temperature of the power generation layer, and the strength that allows thermoelectric evaluation to be performed can be ensured.

Example 1

Figure 2:
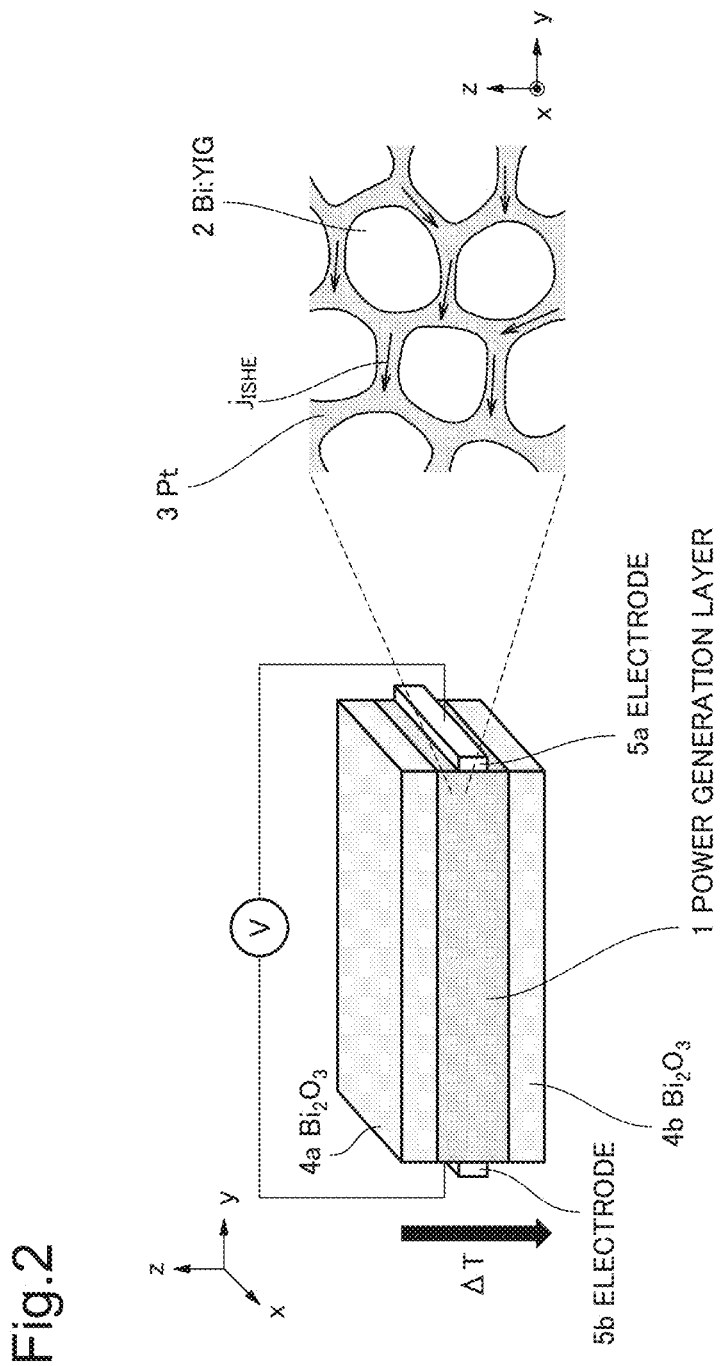
FIG. 2 is a diagram illustrating a thermoelectric conversion element of Example 1.

FIG. 2 illustrates an example according to the first example embodiment of the present invention. Herein, Pt (melting point: 1,768° C.) and Bi:YIG (melting point: 1,555° C.) are employed as a metal material and a magnetic insulator material constituting a composite body of the power layer 1, respectively. Further, bismuth oxide $Bi_2O_3$ (melting point: 817° C.) of which melting point is lower than that of each of Pt and Bi:YIG is employed as the support layer 4.

In an experiment, firstly, a Pt/Bi:YIG powder formed by depositing Pt in a film thickness of 15 nm on a surface of a Bi:YIG powder of which the particle size is approximately 5 nm is prepared. The Pt/Bi:YIG powder is prepared as follows. A Bi:YIG sintered body is milled by employing a jet mill and thereafter heat treatment is carried out in an oxygen atmosphere. The milled sintered body after the heat treatment is put into a sample stage with a stirring device, and a platinum thin film is sputter-deposited on a surface of the milled sintered body by a magnetron sputtering device employing a platinum target.

By employing the thus prepared Pt/Bi:YIG powder and a $Bi_2O_3$ powder of which the particle size is approximately 7.5 μm, these powders are laminated in three layers in sequential order of the $Bi_2O_3$ powder, the Pt/Bi:YIG powder, and the $Bi_2O_3$ powder, filled in a die, press-molded at 100 MPa, and thereafter sintered at 600° C. for 2 hours. A temperature of 800° C. or more is generally required for sintering a simplex of the Pt/Bi:YIG powder, and it is difficult to ensure the strength that allows thermoelectric evaluation to be performed at a lower temperature. However, herein it is verified that an element with a comparatively high strength can be produced even at 600° C. by sandwiching the Pt/Bi:YIG powder between the $Bi_2O_3$ powders, which have a low sintering temperature, and then sintering.

Figure 3A:
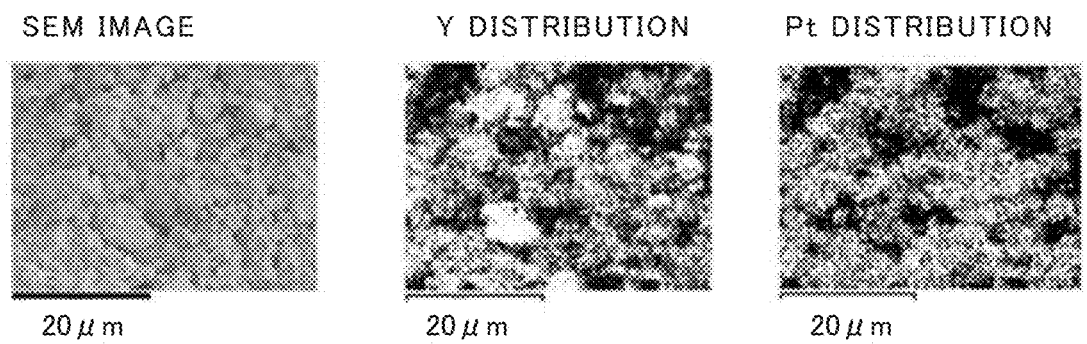
FIG. 3A is a sectional view of a power generation layer in the thermoelectric conversion element of Example 1 produced by sintering at 600° C.

FIG. 3A illustrates a sectional view of a power generation layer 1 composed of a Pt—Bi:YIG composite structure of the element produced by the above condition by employing energy dispersive X-ray spectrometry (EDX) employing a scanning electron microscope (SEM). In the figure, the left end image is a sectional SEM image, and the right two images are images acquired by mapping the distributions of chemical elements Y and Pt in a region of the SEM image, respectively, by employing the EDX. In the mapping images of the Y and Pt distributions, white portions are locations in which Y or Pt exists.

Figure 3B:
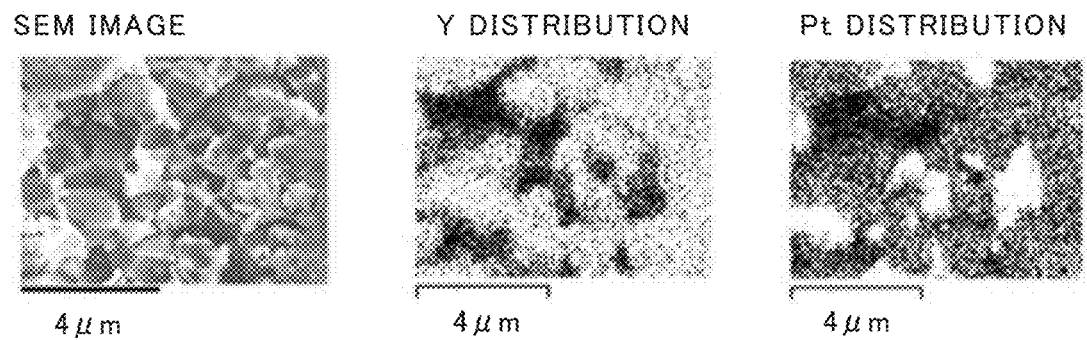
FIG. 3B is a sectional view of a power generation layer in the element manufactured by sintering at 900° C.

For the purpose of comparison, FIG. 3B illustrates a similar sectional view of the element formed by sintering the same material at a high temperature of 900° C. for 2 hours after being press-molded. In FIG. 3B, the Pt distribution includes many black portions, namely portions at which Pt does not exist. Therefore, in the element sintered at 900° C., it is found that Pt completely separates from the Bi:YIG distribution (a Y distribution), and Pt, which is to be essentially formed in the shape of a film of which thickness is 15 nm, is aggregated as a cluster of the order of several μm.

On the other hand, in the element in FIG. 3A produced at 600° C., it is found that Pt is entirely dispersed in such a way as to overlap the Bi:YIG distribution (the Y distribution), and a thin Pt film retains a network structure without being aggregated.

Figure 4:
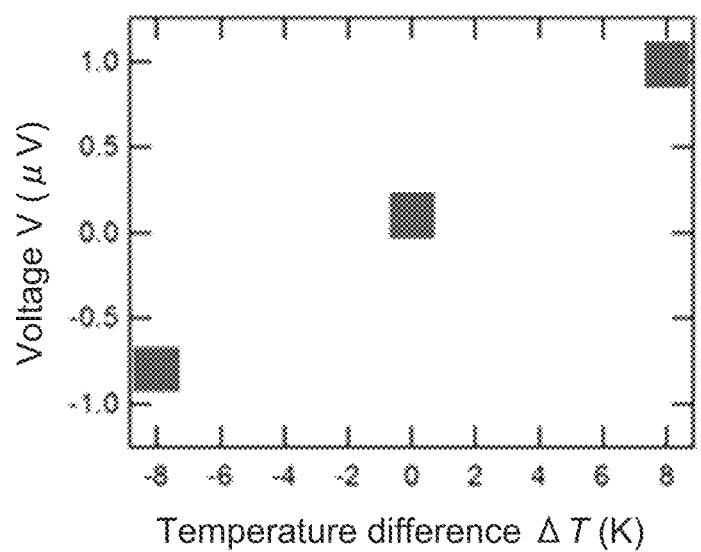
FIG. 4 is a graph illustrating a temperature difference dependency of a thermoelectromotive power of the thermoelectric conversion element according to Example 1.

FIG. 4 illustrates a ΔT dependency of a thermoelectromotive power V when a temperature difference ΔT is applied between the top and bottom of the produced element of FIG. 2, that is, in a perpendicular direction. As illustrated from this graph, the thermoelectromotive power V based on the spin Seebeck effect is actually verified. The internal resistance is R=2.2Ω.

Other than the above-described method, the Pt/Bi:YIG powder can be produced by a sol-gel method. For example, the following method is appliable. A Bi:YIG powder is produced according to general procedures of the sol-gel method, and the produced powder is well dried and thereafter heat-treated in the atmosphere. The heat-treated powder is washed, and a platinum thin film is formed on a surface of the Bi:YIG powder by employing electroless plating.

Second Example Embodiment

Figure 5:
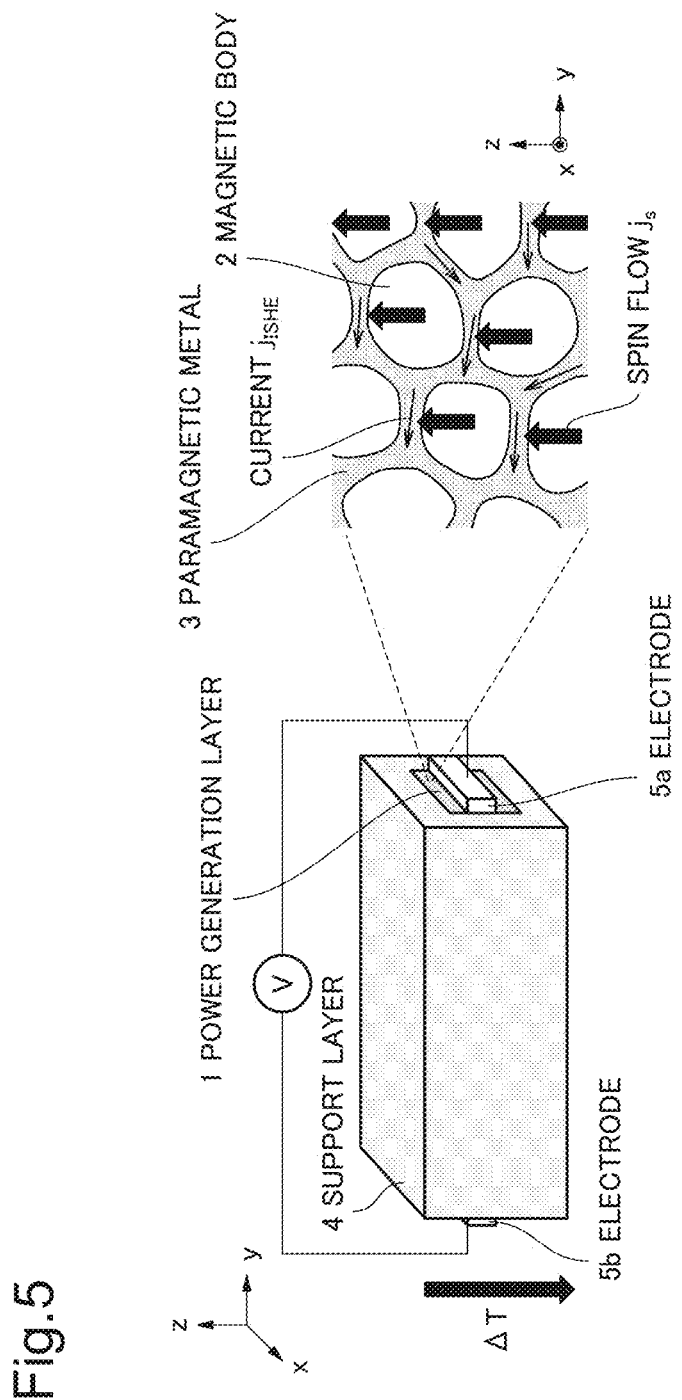
FIG. 5 is a perspective view illustrating a thermoelectric conversion element that is a second example embodiment of the present invention and a sectional view of a power generation layer.

Next, FIG. 5 illustrates a schematic diagram of a thermoelectric conversion element that is a second example embodiment of the present invention. As in the first example embodiment, this element is composed of: a power generation layer 1 composed of a paramagnetic metal-magnetic insulator composite structure in which a paramagnetic metal 3 is dispersed in a net shape around a granulated magnetic body 2; a support layer 4 that supports the power generation layer; and electrodes 5a and 5b that take out electromotive power. As materials for the magnetic body 2, the paramagnetic metal 3, and the support layer 4, similar materials to those employed in the first example embodiment can be employed.

A difference from the first example embodiment is that in the first example embodiment, the support layer 4 is disposed on the top and bottom of the power generation layer, whereas in the present example embodiment, as illustrated in FIG. 5, the support layer 4 is disposed in such a way as to surround four sides, which is the top, the bottom, the front, and the depth, of the power generation layer. That is, the support layer 4 is disposed on each of: a first plane in the +z direction of the power generation layer 1 and a second plane in the opposite −z direction; and a fifth plane in the +y direction and a sixth plane in the opposite −y direction. Therefore, in FIG. 5, the power generation layer 1 can only be seen on a third plane and a fourth plane. It is desirable that the support layers on the four planes are integrated with and connect to one another. A higher strength of the element can be thereby ensured.

Example 2

Figure 6:
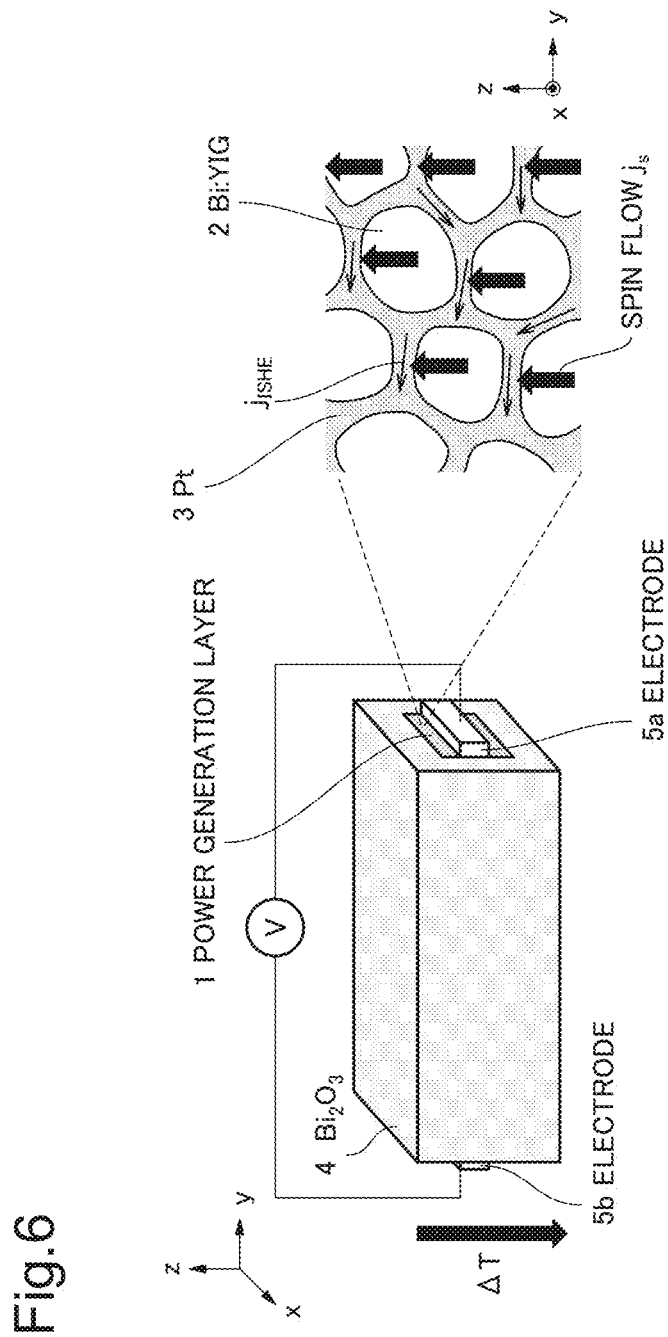
FIG. 6 is a diagram illustrating an example of the thermoelectric conversion element that is the second example embodiment of the present invention.

FIG. 6 illustrates an example according to the second example embodiment of the present invention. As the constituent materials, as in Example 1 described previously, Pt (melting point: 1,768° C.) and Bi:YIG (melting point: 1,555° C.) are employed as the metal material and the magnetic insulator material that constitutes the composite material for the power generation layer 1, respectively, and bismuth oxide $Bi_2O_3$ (melting point: 817° C.) of which melting point is lower than that of each of these substances is employed as the support layer 4.

In an experiment, as in Example 1, a $Bi_2O_3$ powder of which the particle size is approximately 7.5 μm and a Pt/Bi:YIG powder of which the particle size is approximately 5 μm are employed, and these powders are first laminated in three layers and filled in a die and then press-molded at 100 Mpa. Then, the press-molded powders are temporarily taken out from the die and rotated 90 degrees, and the $Bi_2O_3$ powder is laminated on the top and bottom and press-molded again, thereby a structure in which the four sides of Pt/Bi:YIG are surrounded by the $Bi_2O_3$ powder are prepared. The element of FIG. 6 is then produced by sintering the structure at 600° C. for 2 hours.

From the subsequent characteristic evaluation, a sufficient strength and the electromotive power based on the spin Seebeck effect could be verified.

Third Example Embodiment

Figure 7:
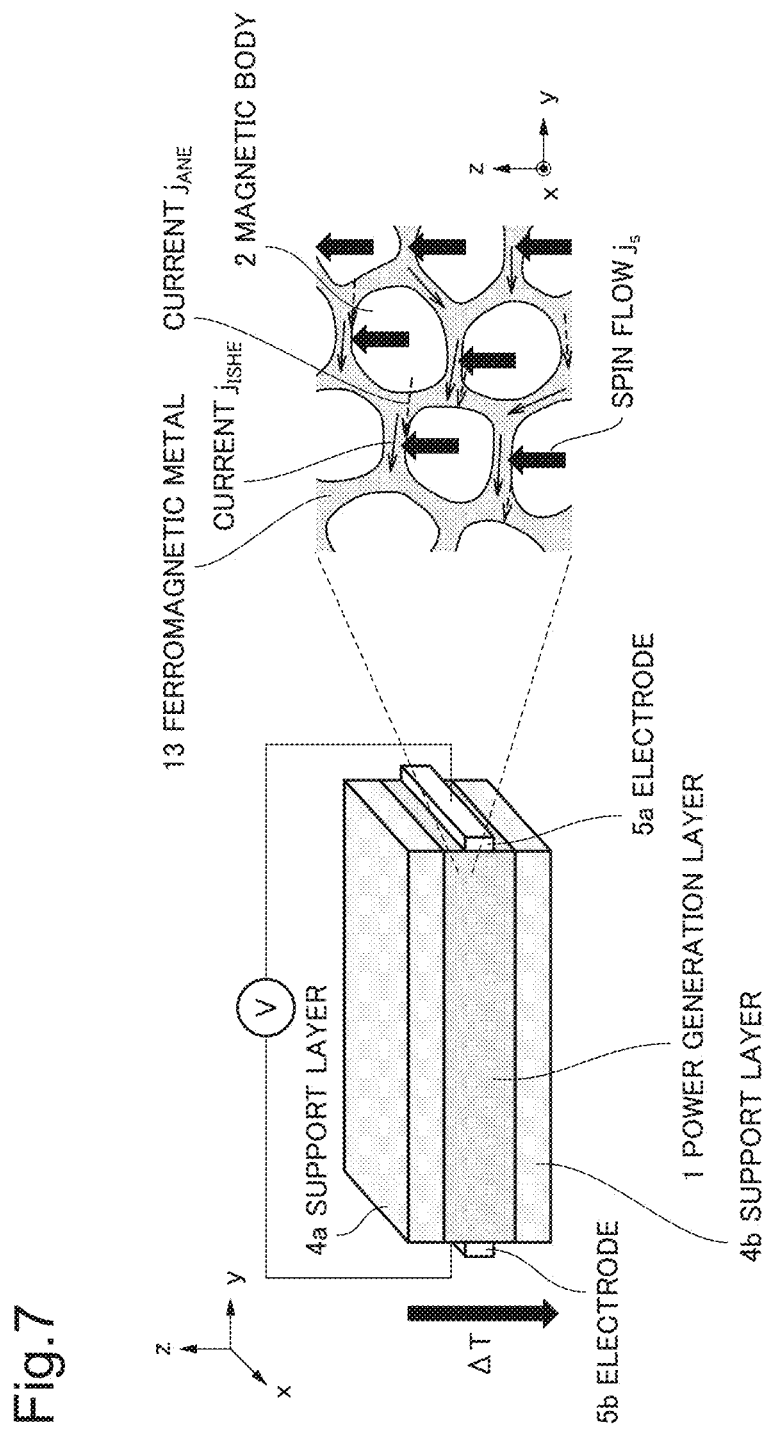
FIG. 7 is a perspective view illustrating a thermoelectric conversion element that is a third example embodiment of the present invention and a sectional view of the power generation layer.

Next, FIG. 7 illustrates a schematic diagram of a thermoelectric conversion element that is a third example embodiment of the present invention.

A power generation layer 1 is composed of a ferromagnetic metal-magnetic insulator composite structure in which a ferromagnetic metal 13 having magnetism is dispersed in a net shape around a granulated magnetic body 2. Further, as in the first example embodiment, the power generation layer 1 has a structure in which support layers 4a and 4b for enhancing the strength of the element and electrodes 5a and 5b that take out electromotive power are disposed.

Herein, as in the first embodiment, an yttrium iron garnet (YIG), a $(Ni, Zn, Fe)_3O_4$ ferrite, or the like may be employed as the magnetic body 2.

As the ferromagnetic metal 13, it is desirable to employ Fe, Ni, Co, or an alloy material (such as FePt, NiPt, or CoPt) composed of these substances and Pt, W, Ta, Au, Pd, Ru, Ir, or the like of which spin orbit interaction is great.

As the support layers 4a and 4b, as in the first example embodiment, it is desirable to employ a nonconductive insulator material or a semiconductor material of which resistivity is equal to or more than 1 Ωm. It is desirable that the ferromagnetic metal 13 has a same magnetization direction as the magnetic body 2.

When a temperature gradient is applied to such an element, in addition to a current $j_{ISHE}$ exerted by the spin Seebeck effect and the inverse spin Hall effect, a current $j_{ANE}$ is further generated in the ferromagnetic metal 13 by the anomalous Nernst effect that is a similar thermoelectromotive effect occurring in the magnetic metal, and these currents are added and output ($j_{out}=j_{ISHE}+j_{ANE}$). Therefore, it becomes possible to acquire a greater thermoelectromotive power in comparison with the element of the first example embodiment.

In the present example embodiment, as in the second example embodiment, a support layer may be formed on four planes.

Example 3

Figure 8:
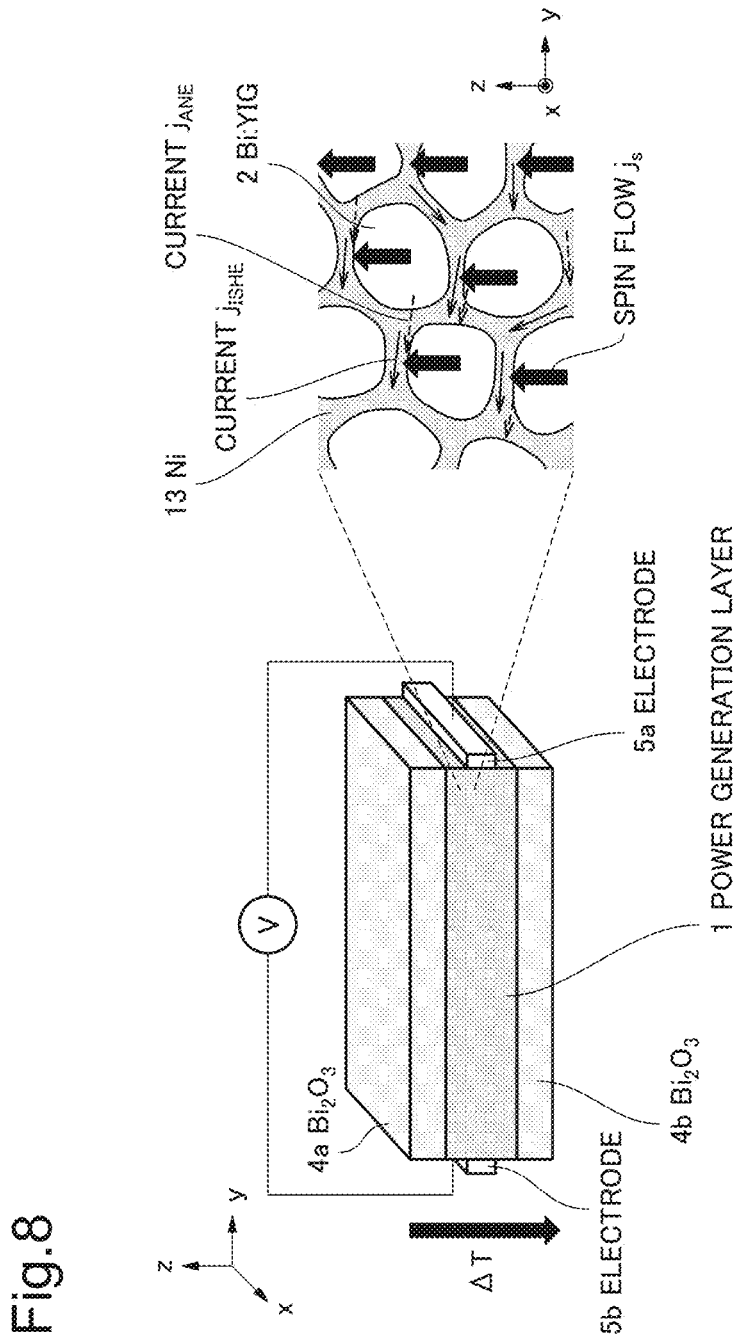
FIG. 8 is a diagram illustrating an example of the thermoelectric conversion element that is the third example embodiment of the present invention.

FIG. 8 illustrates an example according to the third example embodiment of the present invention. As the constituent materials, Ni (melting point: 1,455° C.) and Bi:YIG (melting point: 1,555° C.) are employed as a metal material and a magnetic insulator material constituting a composite of the power generation layer 1, respectively, and bismuth oxide $Bi_2O_3$ (melting point: 817° C.) is employed as a support layer 4 as in the first example embodiment. In an experiment, first, an Ni/Bi:YIG powder, in which Ni is deposited in a film thickness of 15 nm on a surface of a Bi:YIG powder of which particle size is approximately 5 μm, is prepared. Then, by employing the prepared Ni/Bi:YIG powder and a $Bi_2O_3$ powder of which particle size is approximately 7.5 μm, the powders are laminated in three layers in sequential order of the $Bi_2O_3$ powder, the Ni/Bi:YIG powder, and the $Bi_2O_3$ powder, and the laminated powders are press-molded at 100 Mpa. Lastly, the element of FIG. 8 is produced by sintering the press-molded powders at 600° C. for 2 hours.

From the subsequent characteristic evaluation, a sufficient strength and the thermoelectromotive power based on the spin Seebeck effect and the anomalous Nernst effect could be verified.

Although a magnetic insulator is employed as the magnetic body 2 in Examples 1 to 3, a magnetic material such as permalloy having conductivity, an iron alloy, or magnetite may be employed without limitation to such a magnetic insulator.

Fourth Example Embodiment

Figure 9:
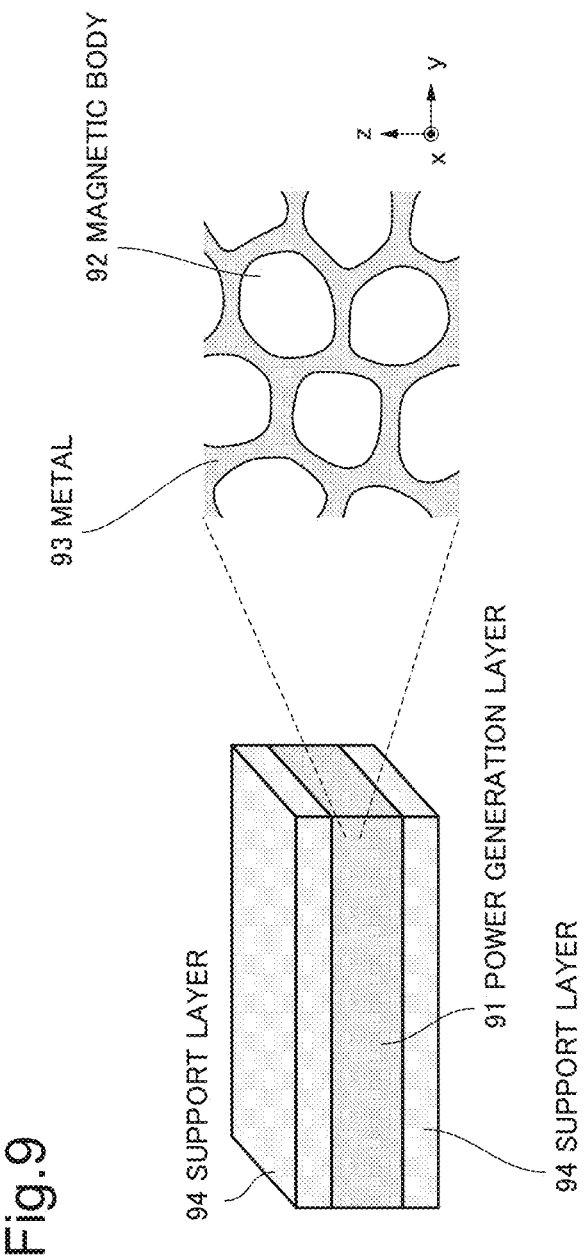
FIG. 9 is a diagram describing a thermoelectric conversion element according to a fourth example embodiment of the present invention.

FIG. 9 is a diagram illustrating a thermoelectric conversion element according to a fourth example embodiment of the present invention. The thermoelectric conversion element has a support layer 94 including a power generation layer 91 and a sintered body, and the power generation layer 91 has a metal-magnetic insulator composite structure in which a metal 93 is formed in a net shape around a sintered body of a granulated magnetic body 92. Further, the support layer 94 is formed in such a way as to be in contact with the top and bottom or the left and right of the power generation layer 91, and the minimum sintering temperature of the support layer 94 is lower than the minimum sintering temperature of the power generation layer 91.

FIG. 10 is a diagram describing a method of manufacturing the thermoelectric conversion element according to the present example embodiment. Power generation layer powder 101 formed by coating the periphery of a granulated magnetic insulator 103 with the metal 93 is sandwiched between support layer powders 104 of which minimum sintering temperature is lower than that of the power generation layer powder 101, and are press-molded and thereafter sintered.

The minimum sintering temperature of the support layer 94 is lower than the minimum sintering temperature of the power generation layer 91 and thus the element can be integrally solidified at a high strength even by low temperature heat treatment of which sintering temperature is lower than an essential sintering temperature of the power generation layer, and a strength that allows thermoelectric evaluation to be performed can be ensured.

Although a part or all of the above example embodiments can be described as in the following supplementary notes, the present invention is not limited to these supplementary notes.

(Supplementary Note 1)
A thermoelectric conversion element including a support layer including a power generation layer and a sintered body, wherein the power generation layer includes a metal-magnetic body composite structure in which a metal is formed in a net shape, around a sintered body of a granulated magnetic body, the support layer is formed in such a way as to be in contact with the top and bottom or the left and right of the power generation layer, and a minimum sintering temperature of the support layer is lower than a minimum sintering temperature of the power generation layer.

(Supplementary Note 2)
The thermoelectric conversion element according to supplementary note 1, wherein the metal exists in a net shape in such a way as to fill a gap between a particle and a particle of the magnetic body.

(Supplementary Note 3)
The thermoelectric conversion element according to supplementary note 1 or 2, wherein the support layer is disposed on four sides in such a way as to surround the power generation layer.

(Supplementary Note 4)
The thermoelectric conversion element according to any one of supplementary notes 1 to 3, wherein the magnetic body has magnetism in an in-plane direction.

(Supplementary Note 5)
The thermoelectric conversion element according to any one of supplementary notes 1 to 4, wherein the support layer is composed of an insulator material or a semiconductor material of which resistivity is equal to or more than 1 Ωm.

(Supplementary Note 6)
The thermoelectric conversion element according to any one of supplementary notes 1 to 5, wherein a melting point of a material constituting the supporting layer is equal to or more than 600° C. and equal to or less than 1,200° C.

(Supplementary Note 7)
The thermoelectric conversion element according to supplementary note 6, wherein a material constituting the support layer is $Bi_2O_3$.

(Supplementary Note 8)
The thermoelectric conversion element according to any one of supplementary notes 1 to 7, wherein the metal is composed of a ferromagnetic metal material having magnetism.

(Supplementary Note 9)
The thermoelectric conversion element according to supplementary note 8, wherein the metal has a same magnetization direction as the magnetic body.

(Supplementary Note 10)
The thermoelectric conversion element according to any one of supplementary notes 1 to 9, wherein a pair of electrodes are provided in the power generation layer.

(Supplementary Note 11)
A method of manufacturing a thermoelectric conversion element, including: sandwiching a power generation layer powder formed by coating a periphery of a granulated magnetic body with a metal, between support layer powders of which a minimum sintering temperature is lower than a minimum sintering temperature of the power generation layer powder; and press-molding and thereafter sintering.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2017-244458, filed on Dec. 20, 2017, the disclosure of which is incorporated herein in its entirety by reference.

REFERENCE SIGNS LIST 1, 91 Power generation layer
2, 92 Magnetic body
3 Paramagnetic metal
4, 4a, 4b, 94 Support layer
5a, 5b Electrode
13 Ferromagnetic metal
93 Metal
101 Power generation layer powder
103 Granulated magnetic insulator
104 Support layer powder

The invention claimed is:

1. A thermoelectric conversion element comprising a support layer including a power generation layer and a sintered body, wherein the power generation layer includes a metal-magnetic body composite structure in which a metal is formed in a net shape, around a granulated magnetic body, the support layer is formed in such a way as to be in contact with a top and a bottom or a left and a right of the power generation layer, and a minimum sintering temperature of the support layer is lower than a minimum sintering temperature of the power generation layer.

2. The thermoelectric conversion element according to claim 1, wherein the metal exists in a net shape in such a way as to fill a gap between a particle and a particle of the magnetic body.

3. The thermoelectric conversion element according to claim 2, wherein the support layer is disposed on four sides in such a way as to surround the power generation layer.

4. The thermoelectric conversion element according to claim 2, wherein the magnetic body has magnetism in an in-plane direction.

5. The thermoelectric conversion element according to claim 2, wherein the support layer is composed of an insulator material or a semiconductor material of which resistivity is equal to or more than $1\Omega m$.

6. The thermoelectric conversion element according to claim 2, wherein a melting point of a material constituting the supporting layer is equal to or more than 600° C. and equal to or less than 1,200° C.

7. The thermoelectric conversion element according to claim 1, wherein the support layer is disposed on four sides in such a way as to surround the power generation layer.

8. The thermoelectric conversion element according to claim 7, wherein the magnetic body has magnetism in an in-plane direction.

9. The thermoelectric conversion element according to claim 7, wherein the support layer is composed of an insulator material or a semiconductor material of which resistivity is equal to or more than $1\Omega m$.

10. The thermoelectric conversion element according to claim 7, wherein a melting point of a material constituting the supporting layer is equal to or more than 600° C. and equal to or less than 1,200° C.

11. The thermoelectric conversion element according to claim 1, wherein the magnetic body has magnetism in an in-plane direction.

12. The thermoelectric conversion element according to claim 11, wherein the support layer is composed of an insulator material or a semiconductor material of which resistivity is equal to or more than $1\Omega m$.

13. The thermoelectric conversion element according to claim 11, wherein a melting point of a material constituting the supporting layer is equal to or more than 600° C. and equal to or less than 1,200° C.

14. The thermoelectric conversion element according to claim 1, wherein the support layer is composed of an insulator material or a semiconductor material of which resistivity is equal to or more than $1\Omega m$.

15. The thermoelectric conversion element according to claim 1, wherein a melting point of a material constituting the supporting layer is equal to or more than 600° C. and equal to or less than 1,200° C.

16. The thermoelectric conversion element according to claim 15, wherein a material constituting the support layer is $Bi_2O_3$.

17. The thermoelectric conversion element according to claim 1, wherein the metal is composed of a ferromagnetic metal material having magnetism.

18. The thermoelectric conversion element according to claim 17, wherein the metal has a same magnetization direction as the magnetic body.

19. The thermoelectric conversion element according to claim 1, wherein a pair of electrodes are provided in the power generation layer.

20. A method of manufacturing a thermoelectric conversion element, comprising: sandwiching a power generation layer powder formed by coating a periphery of a granulated magnetic body with a metal, between support layer powders of which a minimum sintering temperature is lower than a minimum sintering temperature of the power generation layer powder; and press-molding and thereafter sintering.

* * * * *